US006987822B2

(12) United States Patent
Huber

(10) Patent No.: US 6,987,822 B2
(45) Date of Patent: Jan. 17, 2006

(54) CIRCUIT AND METHOD FOR REDUCING NOISE INTERFERENCE IN DIGITAL DIFFERENTIAL INPUT RECEIVERS

(75) Inventor: Brian W. Huber, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 945 days.

(21) Appl. No.: 09/805,742

(22) Filed: Mar. 13, 2001

(65) Prior Publication Data

US 2002/0131535 A1 Sep. 19, 2002

(51) Int. Cl.
*H04L 27/06* (2006.01)

(52) U.S. Cl. ....................................... 375/346; 375/316

(58) Field of Classification Search ................ 375/316, 375/346, 349

See application file for complete search history.

(56) References Cited

U.S. PATENT DOCUMENTS 5,369,409 A * 11/1994 Urabe et al. ................ 342/133
6,040,731 A * 3/2000 Chen et al. ................. 327/359
6,374,337 B1 * 4/2002 Estakhri ..................... 711/169

* cited by examiner

*Primary Examiner*—Kevin Burd
(74) *Attorney, Agent, or Firm*—Dorsey & Whitney, LLP

(57) ABSTRACT

A circuit and method reduces noise signals coupled to a reference voltage used by a digital differential input receiver having an input that is coupled to an input/output terminal. The circuit and method selectively isolates the reference voltage from the input/output terminal to which output signals are selectively applied. The isolation occurs responsive to detecting that an output signal is being applied to the input/output terminal so that transitions of the output signal are not coupled through the input receiver to generate noise in the reference voltage. In one embodiment, the isolation is provided by placing an isolation circuit between the input receiver and either the input/output terminal or a source of the reference voltage. In another embodiment, the isolation is provided by selectively biasing the input receiver so that coupling of output signal transitions through the input receiver is substantially reduced.

69 Claims, 7 Drawing Sheets

CIRCUIT AND METHOD FOR REDUCING NOISE INTERFERENCE IN DIGITAL DIFFERENTIAL INPUT RECEIVERS

TECHNICAL FIELD

This invention relates to digital differential input circuits for memory devices and other electronic devices, and, more particularly, to a method and circuit that makes such circuits relatively immune to noise.

BACKGROUND OF THE INVENTION

Digital electronic devices, such as memory devices, communicate with external circuitry through input terminals, output terminals, and input/output terminals. These input/output terminals are bi-directional, i.e., digital input signals may be applied to the same terminal to which digital output signals are applied, although not at the same time. One type of input circuit to which input signals are initially applied is a digital differential receiver 10*a*, an example of which is shown in FIG. 1. The differential receiver 10*a* includes a pair of NMOS transistors 14, 16 having their sources coupled to a common node 20. The common node 20 is, in turn, coupled to ground through a NMOS current sink transistor 24 that is biased ON by coupling the gate of the transistor 24 to a suitable bias voltage. A pair of load impedances 30, 32 are coupled between the drains of the respective transistors 14, 16 and a power supply voltage $V_{cc}$. The load impedances 30, 32 may be implemented by a variety of circuit components, such as resistors (not shown) or transistors (not shown). Differential output signals are generated at output nodes 34, 35 between the drains of respective transistors 14, 16 and the load impedances 30, 32. Alternatively, a single-ended output signal may be generated at either one of the output nodes 34, 35. The differential output signals or the single-ended output signal are applied to circuitry internal to an electronic device (not shown), such as a memory device.

The gate of one transistor 14 is coupled to a first input terminal 36, which is, in turn, coupled to a voltage reference source 40. The gate of the other transistor 16 is coupled to a second input terminal 38, which is, in turn, coupled to an externally accessible terminal 44*a*. As shown in FIG. 1, the reference voltage source 40 is also coupled to a plurality of other input receivers 10*b,c . . . n* that are coupled to respective externally accessible terminals 44*b,c . . . n*. If the terminal 44*a* is also an output terminal, i.e., the terminal 44*a* is an input/output terminal, the terminal 44*a* is also coupled to the output of an output driver 50. An input of the output driver 50 is coupled to circuitry internal to an electronic device (not shown).

In operation, a digital input signal is applied to the gate of the transistor 16 through the terminal 44*a*. The magnitude of the input signal is compared to the magnitude of the reference voltage applied to the gate of the transistor 14. If the magnitude of the input signal is greater than the magnitude of the reference voltage, the output signal(s) are considered to be at one logic level. If the magnitude of the input signal is less than the magnitude of the reference voltage, the output signal(s) are considered to be at a different logic level.

One problem that is often encountered with the input receiver 10 of FIG. 1 results from noise signals present in the reference voltage. Noise signals momentarily increase or decrease the magnitude of the reference voltage, thereby altering the voltage at which a transition of the input signal from one logic level to another is detected. Consequently, the timing of transitions of the output signal from the input receiver 10 responsive to transitions of the input signal can vary in an unpredictable manner. An electronic device containing the input receivers 10 must therefore operate with looser timing tolerances, thereby reducing the operating speed of the electronic device.

Noise signals can be coupled to the reference voltage source 40 by several means. For example, output signals from the output driver 50*a* can be coupled through the input receiver 10*a* to the reference voltage source 40. More specifically, since the transistors 14*a*, 16*a* will generally be biased to their conductive operating range, transitions of an output signal from the output driver 50*a* applied to the gate of the transistor 16*a* can be coupled to the common node 20*a*, and from the common node 20*a* to the gate of the transistor 14*a*. These noise signals resulting from the transitions of the output signal are then coupled to the gates of transistor 14*b,c . . . n* in the other input receivers 10*b,c . . . n*. One or more of these other input receivers 10*b, c . . .* n may be receiving an input signal via its respective terminal 44*b,c . . . n* at the same time the output driver 50*a* is applying an output signal to its respective terminal 44*a*. For example terminals 44*b,c* may be receiving signals corresponding to bits of an address at the same time the terminal 44*a* is outputting a signal corresponding to a bit of data. As a result, the timing with which these input receivers 10*b,c . . . n* respond to transitions of input signals can vary in an unpredictable manner.

The noise signals generated in this manner could be reduced significantly by providing each input receiver 10*a, b,c, . . . n* with its own dedicated reference voltage source 40, but doing so might significantly increase the size and cost of integrated circuits using such input receivers 10 because of the large number of terminals 44 typically provided for many integrated circuits.

There is therefore a need for a cost effective method and circuit for making digital differential input receivers 10 more immune to noise generated by respective output drivers 50 coupled to one or more of the terminals 44.

SUMMARY OF THE INVENTION

The present invention is a method and circuit for protecting a reference voltage source from noise generated by applying an output signal to an input/output terminal. The input/output terminal is also coupled to an input receiver that is also coupled to the reference voltage source so that the input receiver can serve as a conduit for coupling transitions of the output signal to the reference voltage source. An output signal detector detects when the output signal is being applied to the input/output terminal. An isolation circuit responds to the output signal being detected by isolating the reference voltage source from the input/output terminal to which the output signal is being applied. According to one aspect of the invention, the isolation circuit is coupled between the input receiver and either the input/output terminal or the reference voltage source. Signals are coupled through the isolation circuit when the output signal is not detected, and signals are substantially blocked from passing through the isolation circuit when the output signal is detected. In another aspect of the invention, the isolation circuit comprises a bias circuit that biases the input receiver to a condition that substantially reduces coupling from the input/output terminal to the reference voltage source responsive to the output signal being detected.

DETAILED DESCRIPTION OF THE INVENTION

Figure 1:
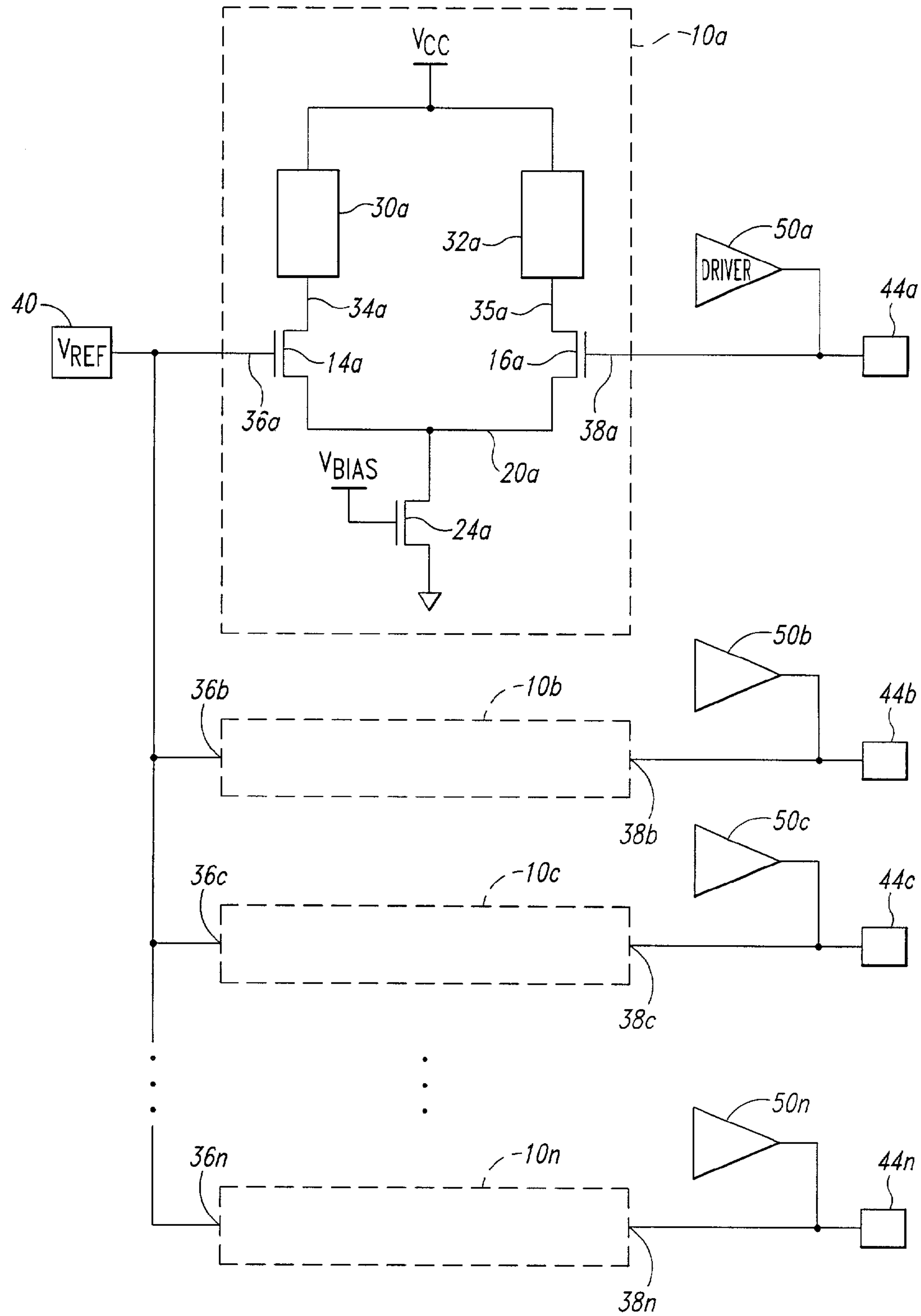
FIG. 1 is a schematic diagram of a plurality of prior art digital differential input receivers that are coupled to respective signal terminals, which are also coupled to respective output drivers.
Figure 2:
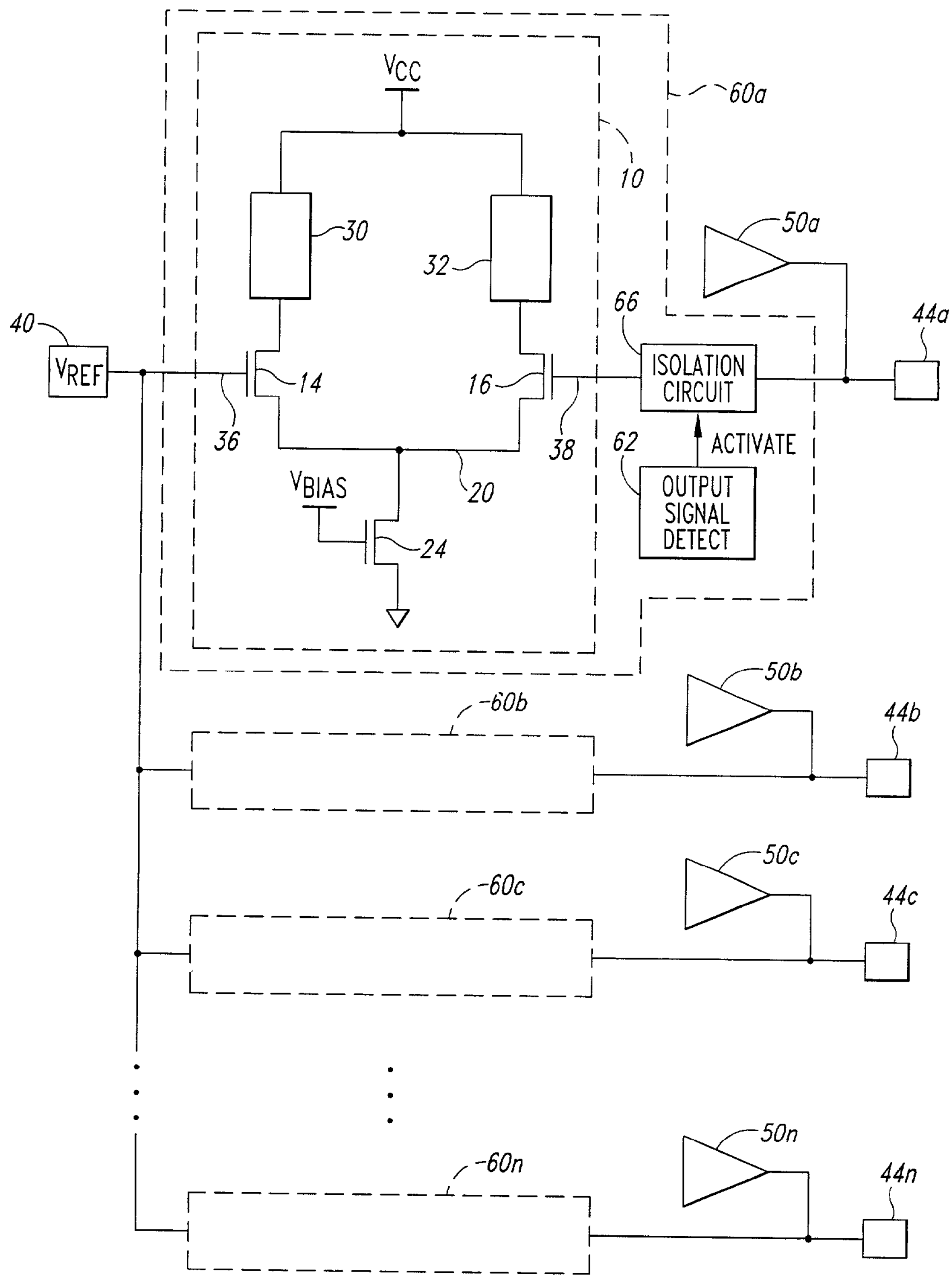
FIG. 2 is a block diagram of a plurality of digital differential input receivers according to one embodiment of the invention.

One embodiment of a circuit that is capable of making the input receiver 10 more immune to noise signals is shown in FIG. 2 in which components common to FIGS. 1 and 2 have been provided with the same reference numerals. In addition to the components of the input receiver 10 shown in FIG. 1, each input receiver circuit 60 in the embodiment of FIG. 2 includes an output signal detector 62 that detects when its respective output driver 50 is applying an output signal to its respective terminal 44. The output signal detector 62 then generates an ACTIVATE signal that is applied to an isolation circuit 66 coupled between the terminal 44 and the second input terminal 38. Although the input receiver circuit 60 shown in FIG. 2 uses an input receiver 10 of the type shown in FIG. 1 in which the second input terminal 38 is coupled to the gate of the transistor 16, other designs for an input receiver may be used.

The output signal detector 62 may perform its function using a variety of techniques. For example, each of the output drivers 50 may be adapted to produce an appropriate signal when the output driver 50 is active, and the output signal detector 62 may then detect such signal and generate the activate signal responsive thereto. By way of further example, each output signal detector 62 may alternatively be adapted to detect output signals genera+ed by its respective output driver 50, and generate the ACTIVATE signal in response thereto.

Regardless of how the output signal detector 62 generates the ACTIVATE signal, the isolation circuit 66 responds to the ACTIVATE signal by isolating the terminal 44 from the second input terminal 38. At all other times, the isolation circuit 66 is operable to couple the terminal 44 to the second input terminal 38 so the input receiver 10 can respond to input signals. As a result, output signals applied to the terminal 44 by the output driver 50 cannot be coupled through the input receiver 10 to the reference voltage source 40.

Figure 3:
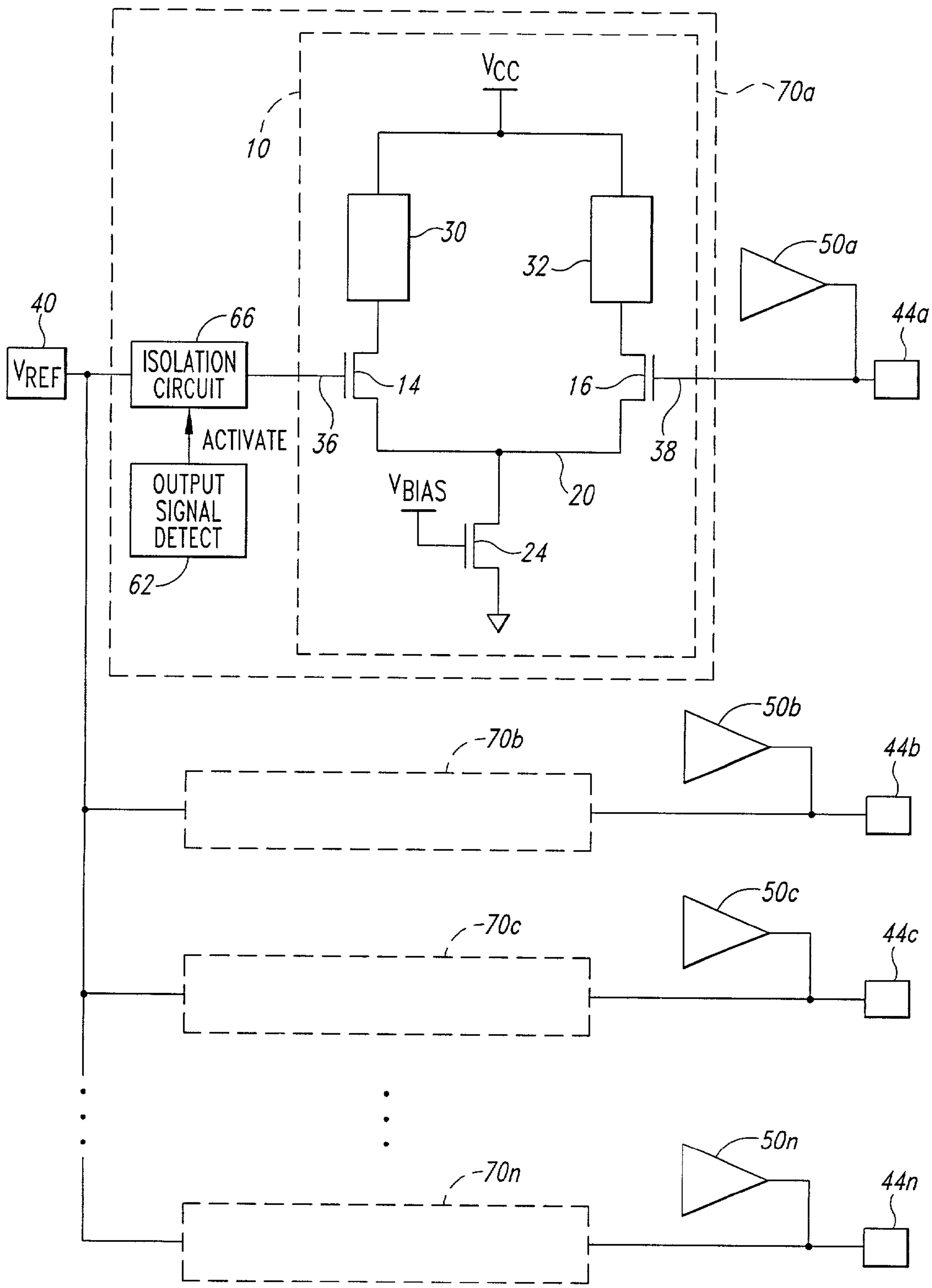
FIG. 3 is a block diagram of a plurality of digital differential input receivers according to another embodiment of the invention.

Another embodiment of an input receiver circuit 70 according to the invention is shown in FIG. 3. The input receiver 70 is identical to the input receiver 60 of FIG. 2 except the isolation circuit 66 is coupled between the reference voltage source 40 and the first input terminal 36. The output signal detector 62 generates the ACTIVATE signal when the output driver 50 generates an output signal, thereby causing the isolation circuit 66 to isolate the first input terminal 36 from the reference voltage source 40.

Figure 4:
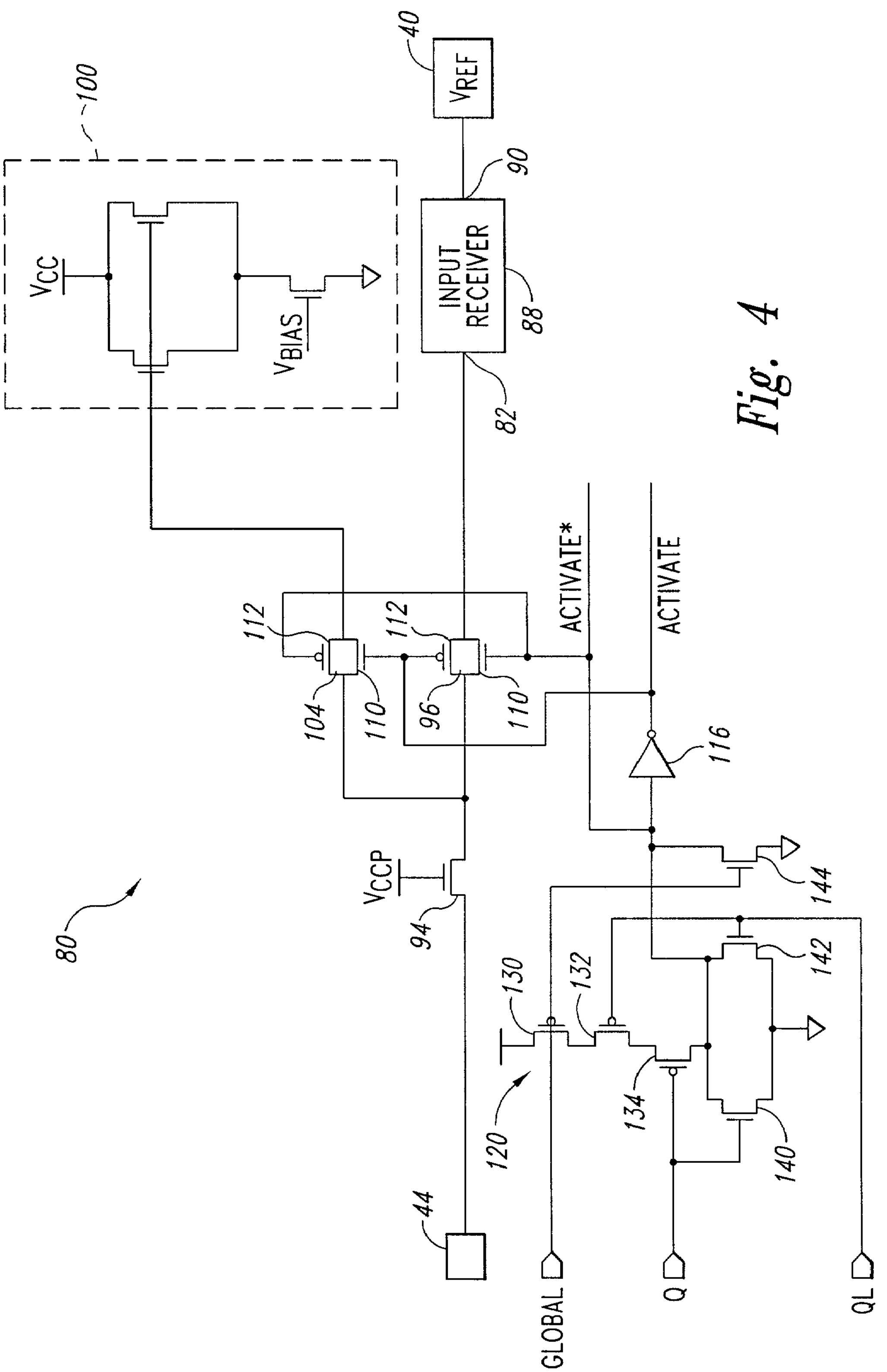
FIG. 4 is a logic diagram of a digital differential input receiver according to still another embodiment of the invention.

A more detailed embodiment of an input receiver circuit 80 according to the invention is shown in FIG. 4 in which components of the input receiver circuit 80 that are identical to previously described components have been provided with the same reference numerals. The terminal 44 is coupled to a second input terminal 82 of a conventional digital differential input receiver 88, such as the input receiver 10 of FIG. 1, through an NMOS transistor 94 and a first pass gate 96. Another input 90 of the input receiver 88 is coupled to a reference voltage source 40, as previously explained. The NMOS transistor 94, which is biased ON by a pumped voltage $V_{CCP}$ applied to its gate, is provided for the purpose of protecting the circuitry in the input receiver circuit 80 from electrostatically generated voltages applied to the terminal 44. The terminal 44 is also coupled to a dummy load circuit 100 through the NMOS transistor 94 and a second pass gate 104. The dummy load circuit 100 is preferably formed by a circuit that is topographically similar to the input receiver 88 so that the input impedance of the input terminal 44 is the same when it is coupled to the dummy load circuit 100 as it is when it is coupled to the input receiver 88. The pass gates 96, 104 are each formed in a conventional manner by an NMOS transistor 110 coupled in parallel with a PMOS transistor 112.

The second pass gate 104 is enabled by applying a high ACTIVATE signal to the NMOS transistor 110 of the pass gate 104 and a low ACTIVATE* signal to the PMOS transistor 112 of the pass gate 104. The ACTIVATE signal is generated by coupling the ACTIVATE* signal through an inverter 116. The first pass gate 96 is enabled by applying a low ACTIVATE signal to the NMOS transistor 110 of the pass gate 96 and a high ACTIVATE* signal to the PMOS transistor 112 of the pass gate 96. The pass gates 96, 104 are thus alternately enabled, with the pass gate 104 being enabled by an active high ACTIVATE signal and the pass gate 96 being enabled by an inactive low ACTIVATE signal.

The ACTIVATE signal is generated by a NOR gate 120 formed in a conventional manner by 3 PMOS transistors 130, 132, 134 coupled in series with 3 NMOS transistors 140, 142, 144. The NOR gate 120 receives Q and QL input signals from an output driver (not shown), at least one of which is high when the output driver coupled to the terminal 44 is generating an output signal. A suitable output driver is shown and described in U.S. patent application Ser. No. 09/808,727 to Brian W. Huber et al., entitled "METHOD AND SYSTEM FOR CONTROLLING THE SLEW RATE OF SIGNALS GENERATED BY OPEN DRAIN DRIVER CIRCUITS," which is incorporated herein by reference. A GLOBAL input to the NOR gate 120 is coupled to the input receiver circuits 80 for all terminals 44 in a device to allow all of the input receivers 88 to be simultaneously isolated from their respective input terminals 44.

In operation, when Q, QL or GLOBAL is high, the NOR gate 120 outputs a low ACTIVATE* signal and the inverter 116 outputs a high ACTIVATE signal to cause the pass gate 96 to isolate the terminal 44 from the input receiver 88 and instead cause the pass gate 112 to couple the terminal 44 to the dummy load 100. When Q, QL and GLOBAL are all low, the NOR gate 120 outputs a high ACTIVATE* signal and the inverter 116 outputs a low ACTIVATE signal to cause the pass gate 96 to couple the terminal 44 to the input receiver 88 and to cause the pass gate 112 to isolate the terminal 44 from the dummy load 100. Therefore, whenever the terminal 44 is receiving an output signal from an output driver, the terminal 44 is isolated from the input receiver 88 so that transitions of the output signal cannot be coupled to the reference voltage source 40. Instead, the terminal 44 is then coupled to the dummy load 100 so the impedance at the terminal 44 remains the same. Whenever the terminal 44 is not receiving an output signal from an output driver, the terminal 44 is coupled to the input terminal 82 of the input receiver 88.

Figure 5:
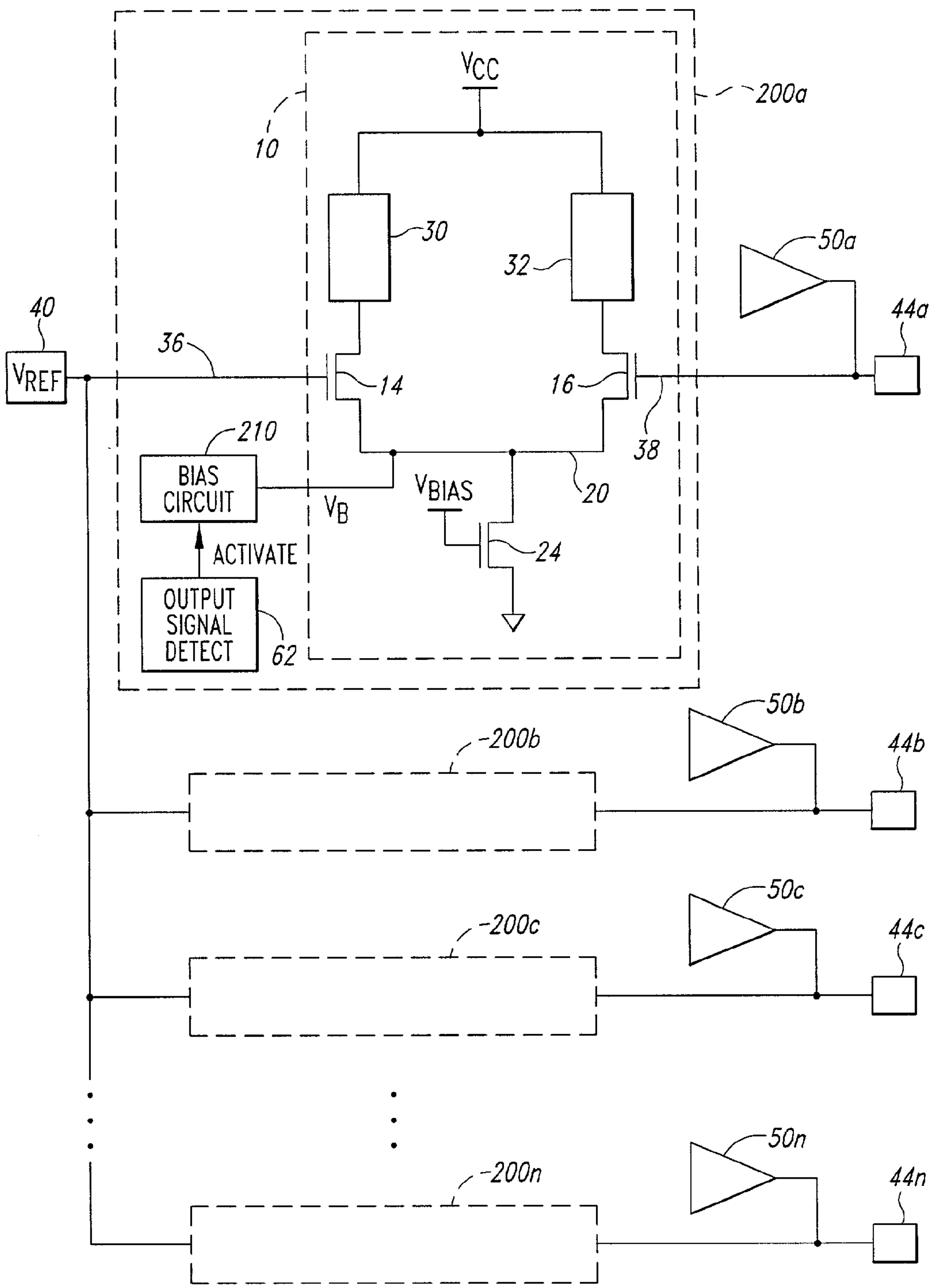
FIG. 5 is a block diagram of a plurality of digital differential input receivers according to another embodiment of the invention.

Another embodiment of a digital differential input receiver 200 that is substantially immune from noise being generated at the reference voltage source 40 responsive to signals from the output driver 50 is shown in FIG. 5. Instead of externally isolating the reference voltage source 40 from the terminal 44, the input receiver 200 internally isolates the reference voltage source 40 from the terminal 44. More specifically, the ACTIVATE signal from the output signal detector 62 is coupled to a bias circuit 210 that outputs a predetermined bias voltage $V_B$ responsive to the ACTIVATE signal. The predetermined voltage has a magnitude that is at least equal to the voltages applied to the gates of the transistors 14, 16 less the threshold voltages $V_T$ of the transistors 14, 16. As a result, when the ACTIVATE signal is generated, the transistors 14, 16 are biased out of their inversion region, thereby substantially preventing transient voltages generated by transitions of signals from the output driver 50 from being coupled to the reference voltage source 40. When the ACTIVATE signal is not being generated, the output of the bias circuit 210 is tri-stated to a high impedance so that it does not affect the operation of the input receiver 200. Thus, by isolating the terminal 44 from the reference voltage source 50 internally within the input receiver 10, the input receiver circuit 200 is rendered substantially immune to noise that would otherwise be generated responsive to transitions of signals from the driver circuit 50.

Although one means of internally isolating the terminal 44 from the reference voltage source 40 is shown in FIG. 5, it will be apparent that other means are possible.

Figure 6:
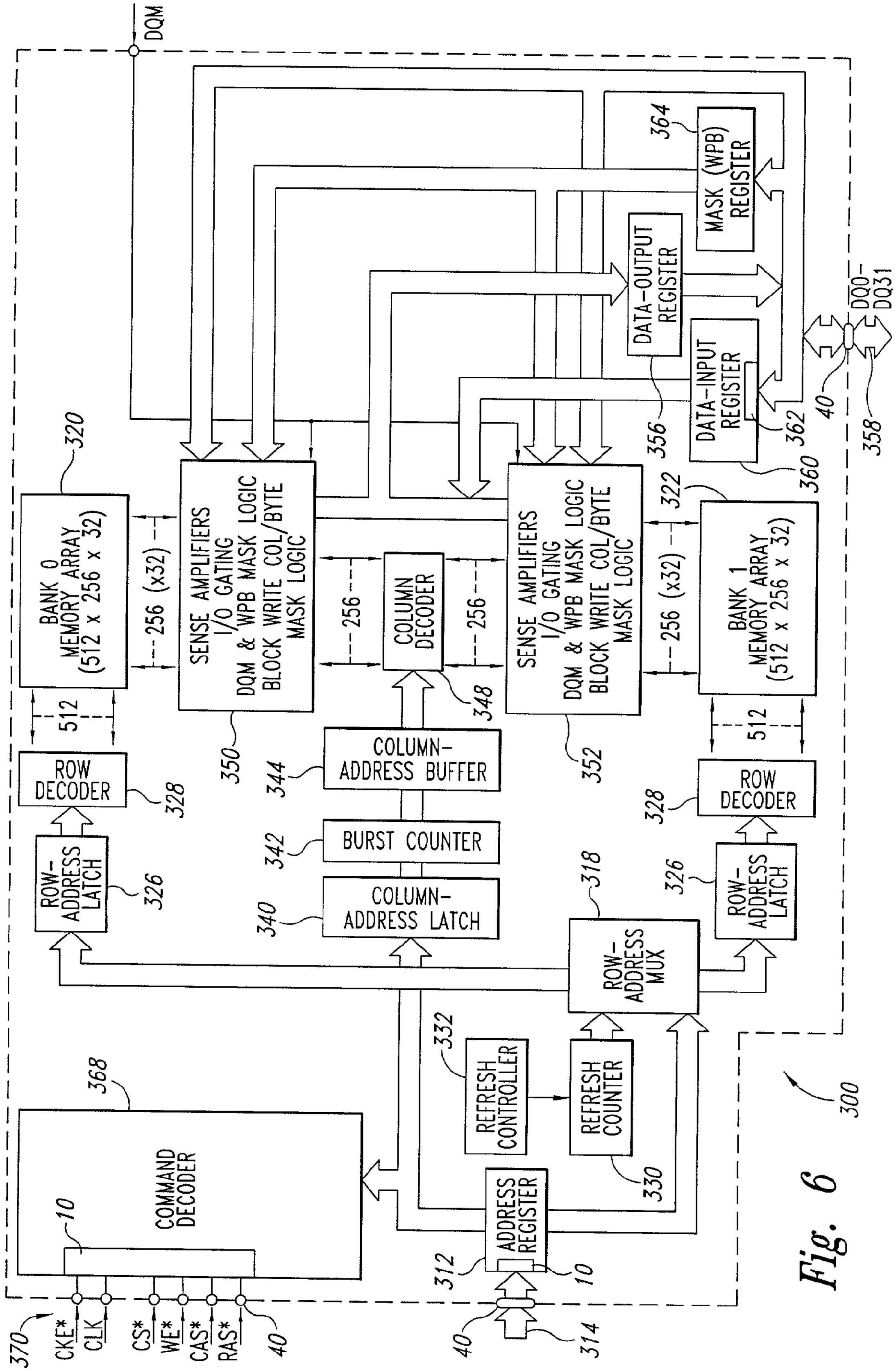
FIG. 6 is a block diagram of a memory device using a digital differential input receiver in accordance with of one embodiment of the invention.

A memory device in the form of a synchronous dynamic random access memory ("SDRAM") 300 that uses one or more input receivers 310 according to the invention is shown in FIG. 6. The SDRAM 300 typically receives both a row address and a column address through an address bus 314 that specify where data are to be transferred to or from within the SDRAM 300. The row and column addresses are initially applied to an address register 312. The addresses normally include a large number of address bits, and the address register 312 is typically coupled to the address bus 314 through an externally accessible terminal 40 for each address bit. The address register 312 may include a digital differential input receiver, such as the input receiver 10 shown in FIG. 1. If noise is coupled to a reference voltage source used in such input receiver 10, the SDRAM 300 may fail to properly register address signals.

The row addresses received by the address register 312 are applied to a row address multiplexer 318. The row address multiplexer 318 couples the row address to a number of components associated with either of two memory bank arrays 320, 322 depending upon the state of a bank address bit forming part of the row address. Associated with each of the arrays 320, 322 is a respective row address latch 326 that stores the row address, and a row decoder 328 that applies various signals to its respective arrays 320 or 322 as a function of the stored row address. The row address multiplexer 318 also couples row addresses to the row address latches 326 for the purpose of refreshing the memory cells in the arrays 320, 322. The row addresses are generated for refresh purposes by a refresh counter 330 that is controlled by a refresh controller 332.

After the row address has been applied to the address register 312 and stored in one of the row address latches 326, a column address is applied to the address register 312. The address register 312 couples the column address to a column address latch 340. In a normal operating mode, the column address is coupled through a burst counter 342 directly from the column address latch 340 to an address buffer 344. However, in a burst operating mode, the bust counter 342 generates a sequence of column addresses starting at the column address applied to the burst counter 342 from the column address latch 340.

After a column address is applied from the burst counter 342 to the column address buffer 344 in either the normal mode or the burst mode, the column address buffer 344 applies the column addresses to a column decoder 348. As is well known in the art, the column decoder 348 applies various signals to respective sense amplifiers and associated column circuitry 350, 352 for the respective arrays 320, 322.

Data to be read from one of the arrays 320, 322 are coupled to the column circuitry 350, 352 for one of the arrays 320, 322, respectively. The data are then coupled to a data output register 356, which contains an output driver circuit (not shown in FIG. 6) applies the data to a data bus 358 through data bus terminals 40. Data to be written to one of the arrays 320, 322 are coupled from the data bus 358 through the data bus terminals 40 and a data input register 360 to the column circuitry 350, 352 where they are transferred to one of the arrays 320, 322, respectively. A mask register 364 may be used to selectively alter the flow of data into and out of the column circuitry 350, 352, such as by selectively masking data to be read from the arrays 320, 322.

The data input register 360 includes a digital differential input receiver circuit 362, such as the input receiver circuit 80 shown in FIG. 4 or the input receiver circuit 200 shown in F*igure* 5. As a result, when data signals are being output from the data output register 356 and transitions of the data signals are thus being applied to the data bus terminals 44, noise signals are not being coupled to the reference voltage source 40 for the input receiver 10 in the address register 312. The address register 312 is thus able to properly register address signals corresponding to address bits designating the location of data in the memory arrays 320, 322 that are to be read.

The above-described operation of the SDRAM 300 is controlled by a command decoder 368 responsive to high-level command signals received on control bus terminals 40 through a control bus 370. The command decoder 368 may also include an input receiver 40 that can fail to properly receive the command signals if noise is present on a reference voltage received from a reference voltage source. These high level command signals, which are typically generated by a memory controller (not shown in FIG. 6), are a clock enable signal CKE*, a chip select signal CS*, a write enable signal WE*, a row address strobe signal RAS*, and a column address strobe signal CAS*, which the "*" designating the signal as active low. The command decoder 368 generates a sequence of control signals responsive to the command signals to carry out the function (e.g., a read or a write) designated by the command signals. These control signals, and the manner in which they accomplish their respective functions, are conventional. Therefore, in the interest of brevity, a further explanation of these control signals will be omitted. The high-level command signals are clocked into the command decoder 368 in synchronism with a clock signal CLK. The CLK signal, or internal clock signals (not shown) generated from the CLK signal, control the timing at which the control signals carry out their respective functions in the SDRAM 300. The control signals are preferably registered with both the rising and falling edges of the CLK signal (or corresponding internal clock signals) so that two operations are accomplished each period of the CLK signal. An SDRAM 300 operating in this manner is known as a "Double Data Rate DRAM."

Figure 7:
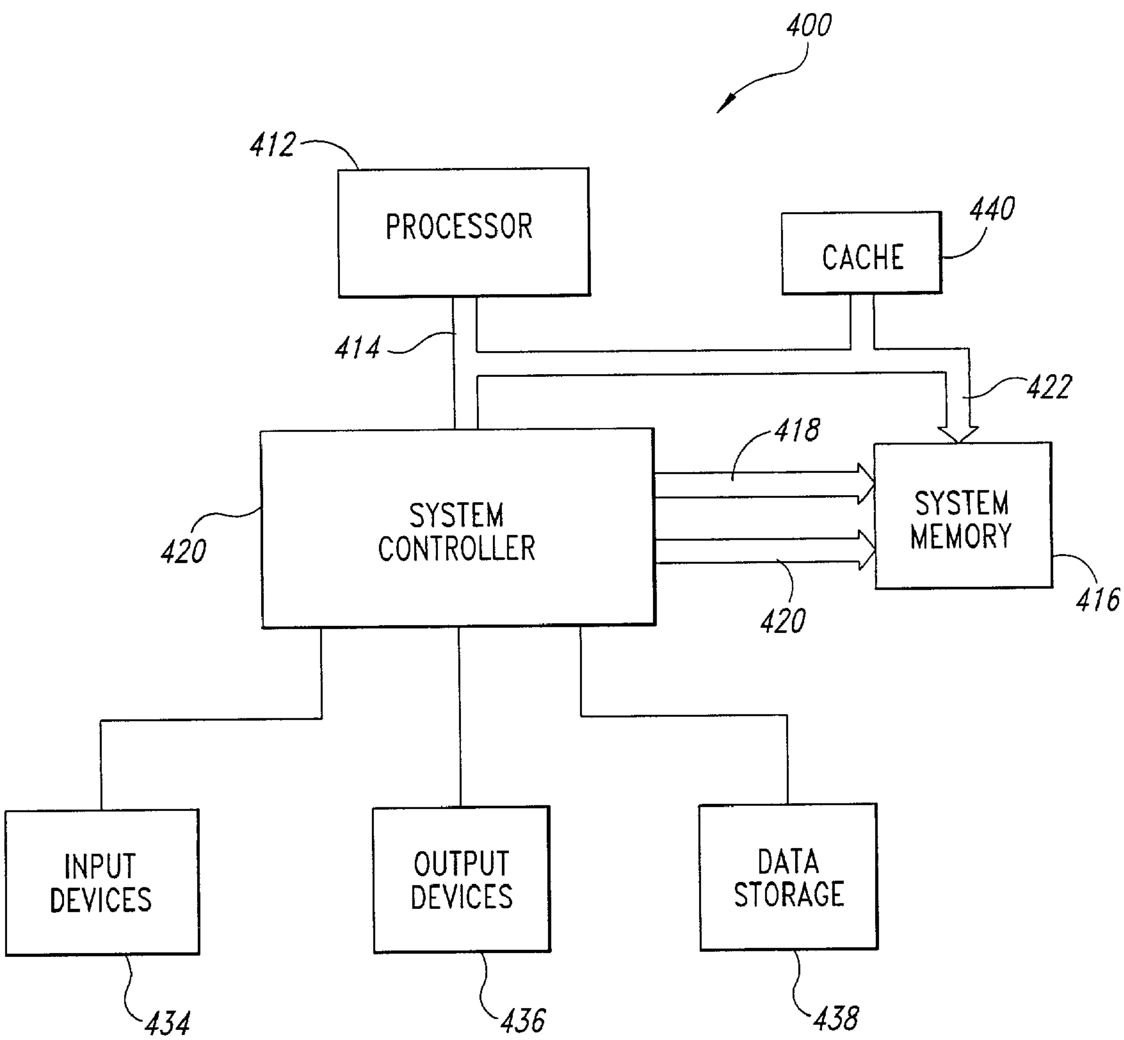
FIG. 7 is a block diagram of a computer system using the memory device of FIG. 6.

The SDRAM 300 of FIG. 6 may be used in a variety of applications, including in a computer system 400 as shown in FIG. 7. The computer system 400 includes a processor 412 for performing various computing functions by executing software to perform specific calculations or tasks. The processor 412 is coupled to a processor bus 414 that normally includes an address bus, a control bus, and a data bus (not separately shown). The processor bus 414 is coupled to a system controller 420 or similar device, such as a memory controller, for controlling the transfer of data between the processor 412 and system memory 416. In the embodiment of FIG. 7, the system memory 416 is implemented using the SDRAM 10 of FIG. 6. The system controller 420 is coupled to the system memory 416 by an address bus 418 and a control bus 420. In the embodiment of FIG. 7, a data bus 422 of the system memory 416 is coupled to the data bus of the processor bus 414, although the data bus 422 of the system memory 416 may be coupled to the processor 412 through the system controller 420 in the same manner as the address bus 418 and the control bus 420. Although the SDRAM 10 is used as the system memory 416, it will be understood the system memory 416 may be implemented by other types of memory devices, such as a packetized memory (not shown), which normally does not include a separate address bus and control bus. The processor 412 is also typically coupled to cache memory 440 through the processor bus 414.

The computer system 400 also includes one or more input devices 434, such as a keyboard or a mouse, coupled to the processor 412 through the system controller 420 and the processor bus 414. Also typically coupled to the processor 412 through the system controller 420 are one or more output devices 436, such as a printer or a video terminal. One or more data storage devices 438 are also typically coupled to the processor 412 through the system controller 420 to allow the processor 412 to store data or retrieve data from internal or external storage media (not shown). Examples of typical storage devices 438 include hard and floppy disks, tape cassettes, and compact disk read-only memories (CD-ROMs).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A digital differential input receiver circuit, comprising:

an input receiver having first and second input terminals, the input receiver being operable to receive a signal at the first input terminal from an input/output terminal;

a reference voltage source coupled to apply a reference voltage to the second input terminal;

an isolation circuit coupled between the input/output terminal and the reference voltage source, the isolation circuit being operable to isolate the input/output terminal from the reference voltage source responsive to an activation signal, the isolation circuit comprising a first pass gate coupled between the input/output terminal and the reference voltage source, the pass gate being operable responsive to the activation signal;

an output signal detector operable to detect an output signal applied to the input/output terminal and to generate the activation signal responsive thereto;

a dummy load; and a second pass gate, the second pass gate being coupled between the input/output terminal and the dummy load.

2. The digital differential input receiver circuit of claim 1 wherein the isolation circuit is coupled between the second input terminal of the input receiver and the reference voltage source.

3. The digital differential input receiver circuit of claim 1 wherein the isolation circuit is coupled between the input/output terminal and the first input terminal of the input receiver.

4. The digital differential input receiver circuit of claim 1 wherein the dummy load comprises a circuit substantially identical to the input receiver.

5. The digital differential input receiver circuit of claim 1 wherein the input receiver includes a pair of differential transistors coupled to each other through a common node, and wherein the isolation circuit comprises a bias circuit operable responsive to the activate signal to bias the differential transistors to a non-linear operating range.

6. The digital differential input receiver circuit of claim 5 wherein the bias circuit is coupled to the common node of the input receiver.

7. The digital differential input receiver circuit of claim 1 wherein the output signal detector comprises a logic gate.

8. The digital differential input receiver circuit of claim 7 wherein the logic gate comprises a NOR gate.

9. A digital differential input receiver, comprising:

input receiver means having first and second input terminals;

first coupling means for coupling a signal from an input/output terminal to the first input terminal of the input receiver means;

reference voltage means for generating a reference voltage;

second coupling means for coupling the reference voltage to the second input terminal of the input receiver means;

isolation means coupled between the input/output terminal and the reference voltage means, the isolation means isolating the input/output terminal from the reference voltage means responsive to an activation signal;

output signal detector means for detecting an output signal applied to the input/output terminal and for generating the activation signal responsive thereto;

dummy load means; and means for coupling the input/output terminal to the dummy load when the output signal detector means detects an output signal being applied to the input/output terminal.

10. The digital differential input receiver of claim 9 wherein the isolation means is coupled between the second input terminal of the input receiver means and the reference voltage means.

11. The digital differential input receiver of claim 9 wherein the isolation means is coupled between the input/output terminal and the first input terminal of the input receiver means.

12. The digital differential input receiver of claim 9, wherein the isolation means comprises bias means for biasing the input receiver means to a non-linear operating range responsive to the activate signal.

13. A memory device, comprising:

a memory array having a plurality of memory cells arranged in rows and columns;

a reference voltage source coupled to generate a reference voltage;

an address decoder coupled to receive a plurality of address signals through respective address terminals, the address signals designating a location in the memory array to be accessed, the address decoder including a plurality of input receivers each having a first input coupled to a respective address terminal and a second input coupled to receive the reference voltage from the reference source;

a command decoder coupled to receive memory command and generate control signals corresponding thereto;

a data output buffer coupled to receive data signals from the memory array, the data output buffer receiving respective data signals and applying the data signals to respective data terminals; and a data input buffer coupled to apply data signals to the memory array, the data input buffer comprising:

a plurality of input receivers each having respective output terminal coupled to the memory array, each input receiver having a first input coupled to a respective one of the data terminals and a second input terminal coupled to receive the reference voltage from the reference source;

a plurality of isolation circuits coupled between a respective one of the data terminals and the reference voltage source, the isolation circuit being operable to isolate the respective data terminal from the reference voltage source responsive to a respective activation signal, each of the isolation circuits comprising:

a first pass gate coupled between a respective one of the data terminals and the reference voltage source, the pass gate being operable responsive to a respective one of the activation signals;

a dummy load; and a second pass gate, the second pass gate being coupled between the respective data terminal and the dummy load; and a plurality of output signal detectors each operable to detect an output signal applied to a respective one of the data terminals by the data output buffer.

14. The memory device of claim 13, wherein the data output buffer comprises a plurality of output drivers each coupled to a respective one of the data terminals to apply respective data signals to the respective data terminals.

15. The memory device of claim 14, wherein each of the output drivers generates a respective output enable signal when the output driver is applying an output signal to the respective data terminal.

16. The memory device of claim 15, wherein each of the output signal detectors is operable to detect a respective output enable signal from a respective output driver and to generate a respective one of the activation signals responsive thereto.

17. The memory device of claim 13 wherein each of the isolation circuits is coupled between the second input terminal of a respective input receiver and the reference voltage source.

18. The memory device of claim 13 wherein each of the isolation circuits is coupled between a respective one of the data terminals and the first input terminal of a respective input receiver.

19. The memory device of claim 13 wherein each of the dummy loads comprises a circuit substantially identical to a respective one of the input receivers.

20. The memory device of claim 13 wherein each of the input receivers comprises a pair of differential transistors coupled to each other through a common node, and wherein each of the isolation circuits comprises a respective bias circuit operable responsive to a respective one of the activate signals to bias the differential transistors to a non-linear operating range.

21. The memory device of claim 20 wherein each of the bias circuits is coupled to the common node of the respective input receiver.

22. The memory device of claim 13 wherein each of the output signal detectors comprises a respective logic gate.

23. The memory device of claim 22 wherein the logic gate comprises a NOR gate.

24. A computer system comprising:

a processor;

a system controller coupled to the processor;

a peripheral device bus coupled to the processor through the system controller;

an input device coupled to the peripheral device bus;

an output device coupled to the peripheral device bus;

a mass storage device coupled to the peripheral device bus; and a memory device coupled to the processor through the system controller, the memory device comprising:

a memory array having a plurality of memory cells arranged in rows and columns;

a reference voltage source coupled to generate a reference voltage;

an address decoder coupled to receive a plurality of address signals through respective address terminals, the address signals designating a location in the memory array to be accessed, the address decoder including a plurality of input receivers each having a first input coupled to a respective address terminal and a second input coupled to receive the reference voltage from the reference source;

a command decoder coupled to receive memory command and generate control signals corresponding thereto;

a data output buffer coupled to receive data signals from the memory array, the data output buffer receiving respective data signals and applying the data signals to respective data terminals; and a data input buffer coupled to apply data signals to the memory array, the data input buffer comprising:

a plurality of input receivers each having respective output terminal coupled to the memory array, each input receiver having a first input coupled to a respective one of the data terminals and a second input terminal coupled to receive the reference voltage from the reference source;

a plurality of isolation circuits coupled between a respective one of the data terminals and the reference voltage source, the isolation circuit being operable to isolate the respective data terminal from the reference voltage source responsive to a respective activation signal, each of the isolation circuits comprising:

a first pass gate coupled between a respective one of the data terminals and the reference voltage source, the pass gate being operable responsive to a respective one of the activation signals;

a dummy load; and a second pass gate, the second pass gate being coupled between the respective data terminal and the dummy load; and a plurality of output signal detectors each operable to detect an output signal applied to a respective one of the data terminals by the data output buffer.

25. The computer system of claim 24 wherein the data output buffer comprises a plurality of output drivers each coupled to a respective one of the data terminals to apply respective data signals to the respective data terminals.

26. The computer system of claim 25 wherein each of the output drivers generates a respective output enable signal when the output driver is applying an output signal to the respective data terminal.

27. The computer system of claim 26 wherein each of the output signal detectors is operable to detect a respective output enable signal from a respective output driver and to generate a respective one of the activation signals responsive thereto.

28. The computer system of claim 24 wherein each of the isolation circuits is coupled between the second input terminal of a respective input receiver and the reference voltage source.

29. The computer system of claim 24 wherein each of the isolation circuits is coupled between a respective one of the data terminals and the first input terminal of a respective input receiver.

30. The computer system of claim 24 wherein each of the dummy loads comprises a circuit substantially identical to a respective one of the input receivers.

31. The computer system of claim 24 wherein each of the input receivers comprises a pair of differential transistors coupled to each other through a common node, and wherein each of the isolation circuits comprises a respective bias circuit operable responsive to a respective one of the activate signals to bias the differential transistors to a non-linear operating range.

32. The computer system of claim 31 wherein each of the bias circuits is coupled to the common node of the respective input receiver.

33. The computer system of claim 24 wherein each of the output signal detectors comprises a respective logic gate.

34. The computer system of claim 33 wherein the logic gate comprises a NOR gate.

35. A method of protecting a reference voltage source from noise generated by applying an output signal to an input/output terminal to which an input receiver is also coupled through a first input terminal of the input receiver, the input receiver further having a second input terminal to which the reference voltage source is coupled, the method comprising:

detecting when the output signal is being applied to the input/output terminal;

when the output terminal is not detected as being applied to the input/output terminal, coupling the reference voltage source to the input/output terminal through the input receiver;

when the output terminal is detected as being applied to the input/output terminal, isolating the reference voltage source from the input/output terminal; and coupling the input/output terminal to a dummy load when the reference voltage source is being isolated from the input/output terminal.

36. The method of claim 35 wherein the act of isolating the reference voltage source from the input/output terminal comprises isolating the reference voltage source from the second input terminal of the input receiver.

37. The method of claim 35 wherein the act of isolating the reference voltage source from the input/output terminal comprises isolating the first input terminal of the input receiver from the input/output terminal.

38. The method of claim 35 wherein the act of isolating the reference voltage source from the input/output terminal comprises biasing a node of the input receiver to a voltage that substantially reduces coupling from the first input terminal of the input receiver to the second input terminal of the input receiver.

39. The method of claim 38 wherein the input receiver comprises a first MOSFET transistor having a gate coupled to the first input terminal and a second NMOS transistor having a gate coupled to the second input terminal and a source coupled to a source of the first NMOS transistor, and wherein the act of biasing a node of the input receiver to a voltage that substantially reduces to coupling from the first input terminal of the input receiver to the second input terminal of the input receiver comprises coupling a bias voltage to the sources of the first and second NMOS transistors.

40. The method of claim 35, further comprising maintaining the impedance at the input/output terminal substantially constant while switching between coupling the reference voltage source to the input/output terminal and isolating the reference voltage source from the input/output terminal.

41. In a memory device having a plurality of input/output terminal coupled to respective output drivers and to respective input receivers each of which is operable to compare an input signal applied to the input/output terminal to a reference voltage generated by a reference voltage source that is coupled to the input receivers for a plurality of the input/output terminals, the method comprising:

detecting when an output signal from a respective one of the output drivers is being coupled to each of the input/output terminals;

when an output signal from each of the output drivers is not detected, coupling the respective input/output terminal to the reference voltage source through the respective input receiver;

when an output signal from each of the output drivers is detected, isolating the respective input/output terminal from the reference voltage source; and coupling the input/output terminal to a dummy load when the reference voltage source is being isolated from the input/output terminal.

42. The method of claim 41 wherein the act of detecting when an output signal is being coupled to each of the input/output terminal comprises:

generating a respective enable signal from each of the output drivers indicative of the output driver being enabled; and detecting each of the enable signals.

43. The method of claim 41 wherein the act of isolating the respective input/output terminal from the reference voltage source comprises isolating the reference voltage source from the input receiver.

44. The method of claim 41 wherein the act of isolating the respective input/output terminal from the reference voltage source comprises isolating the input receiver from the input/output terminal.

45. The method of claim 41 wherein the act of isolating the reference voltage source from the input/output terminal comprises biasing a node of the input receiver to a voltage that substantially reduces to coupling from a terminal of the input receiver that is coupled to the input/output terminal to a terminal of the input receiver that is coupled to the voltage reference source.

46. The method of claim 45 wherein each of the input receiver comprises a first MOSFET transistor having a gate coupled to a respective one of the input/output terminals and a second NMOS transistor having a gate coupled to the reference voltage source a source coupled to a source of the first NMOS transistor, and wherein the act of biasing a node of the input receiver to a voltage that substantially reduces to coupling comprises coupling a bias voltage to the sources of the first and second NMOS transistors.

47. The method of claim 41, further comprising maintaining the impedance at the input/output terminal substantially constant while switching between coupling the reference voltage source to the input/output terminal and isolating the reference voltage source from the input/output terminal.

48. A digital differential input receiver circuit, comprising:

- an input receiver having first and second input terminals, the input receiver being operable to receive a signal at the first input terminal from an input/output terminal;
- a reference voltage source coupled to apply a reference voltage to the second input terminal;
- an isolation circuit coupled between the input/output terminal and the reference voltage source, the isolation circuit being operable to isolate the input/output terminal from the reference voltage source responsive to an activation signal; and
- an output signal detector operable to detect an output signal applied to the input/output terminal and to generate the activation signal responsive thereto, the output signal detector comprises a NOR gate.

49. The digital differential input receiver circuit of claim 48 wherein the isolation circuit is coupled between the second input terminal of the input receiver and the reference voltage source.

50. The digital differential input receiver circuit of claim 48 wherein the isolation circuit is coupled between the input/output terminal and the first input terminal of the input receiver.

51. The digital differential input receiver circuit of claim 48 wherein the isolation circuit comprises a first pass gate coupled between the input/output terminal and the reference voltage source, the pass gate being operable responsive to the activation signal.

52. The digital differential input receiver circuit of claim 48 wherein the input receiver includes a pair of differential transistors coupled to each other through a common node, and wherein the isolation circuit comprises a bias circuit operable responsive to the activate signal to bias the differential transistors to a non-linear operating range.

53. The digital differential input receiver circuit of claim 52 wherein the bias circuit is coupled to the common node of the input receiver.

54. A memory device, comprising:

- a memory array having a plurality of memory cells arranged in rows and columns;
- a reference voltage source coupled to generate a reference voltage;
- an address decoder coupled to receive a plurality of address signals through respective address terminals, the address signals designating a location in the memory array to be accessed, the address decoder including a plurality of input receivers each having a first input coupled to a respective address terminal and a second input coupled to receive the reference voltage from the reference source;
- a command decoder coupled to receive memory command and generate control signals corresponding thereto;
- a data output buffer coupled to receive data signals from the memory array, the data output buffer receiving respective data signals and applying the data signals to respective data terminals; and
- a data input buffer coupled to apply data signals to the memory array, the data input buffer comprising:
  - a plurality of input receivers each having respective output terminal coupled to the memory array, each input receiver having a first input coupled to a respective one of the data terminals and a second input terminal coupled to receive the reference voltage from the reference source;
  - a plurality of isolation circuits coupled between a respective one of the data terminals and the reference voltage source, the isolation circuit being operable to isolate the respective data terminal from the reference voltage source responsive to a respective activation signal; and
  - a plurality of output signal detectors each operable to detect an output signal applied to a respective one of the data terminals by the data output buffer, each of the output signal detectors comprising a respective NOR gate.

55. The memory device of claim 54, wherein the data output buffer comprises a plurality of output drivers each coupled to a respective one of the data terminals to apply respective data signals to the respective data terminals.

56. The memory device of claim 55, wherein each of the output drivers generates a respective output enable signal when the output driver is applying an output signal to the respective data terminal.

57. The memory device of claim 56, wherein each of the output signal detectors is operable to detect a respective output enable signal from a respective output driver and to generate a respective one of the activation signals responsive thereto.

58. The memory device of claim 54 wherein each of the isolation circuits is coupled between the second input terminal of a respective input receiver and the reference voltage source.

59. The memory device of claim 54 wherein each of the isolation circuits is coupled between a respective one of the data terminals and the first input terminal of a respective input receiver.

60. The memory device of claim 54 wherein each of the input receivers comprises a pair of differential transistors coupled to each other through a common node, and wherein each of the isolation circuits comprises a respective bias circuit operable responsive to a respective one of the activate signals to bias the differential transistors to a non-linear operating range.

61. The memory device of claim 60 wherein each of the bias circuits is coupled to the common node of the respective input receiver.

62. A computer system comprising:

a processor;

a system controller coupled to the processor;

a peripheral device bus coupled to the processor through the system controller;

an input device coupled to the peripheral device bus;

an output device coupled to the peripheral device bus;

a mass storage device coupled to the peripheral device bus; and a memory device coupled to the processor through the system controller, the memory device comprising:

a memory array having a plurality of memory cells arranged in rows and columns;

a reference voltage source coupled to generate a reference voltage;

an address decoder coupled to receive a plurality of address signals through respective address terminals, the address signals designating a location in the memory array to be accessed, the address decoder including a plurality of input receivers each having a first input coupled to a respective address terminal and a second input coupled to receive the reference voltage from the reference source;

a command decoder coupled to receive memory command and generate control signals corresponding thereto;

a data output buffer coupled to receive data signals from the memory array, the data output buffer receiving respective data signals and applying the data signals to respective data terminals; and a data input buffer coupled to apply data signals to the memory array, the data input buffer comprising:

a plurality of input receivers each having respective output terminal coupled to the memory array, each input receiver having a first input coupled to a respective one of the data terminals and a second input terminal coupled to receive the reference voltage from the reference source;

a plurality of isolation circuits coupled between a respective one of the data terminals and the reference voltage source, the isolation circuit being operable to isolate the respective data terminal from the reference voltage source responsive to a respective activation signal; and a plurality of output signal detectors each operable to detect an output signal applied to a respective one of the data terminals by the data output buffer, each of the output signal detectors comprising a respective NOR gate.

63. The computer system of claim 62 wherein the data output buffer comprises a plurality of output drivers each coupled to a respective one of the data terminals to apply respective data signals to the respective data terminals.

64. The computer system of claim 63 wherein each of the output drivers generates a respective output enable signal when the output driver is applying an output signal to the respective data terminal.

65. The computer system of claim 64 wherein each of the output signal detectors is operable to detect a respective output enable signal from a respective output driver and to generate a respective one of the activation signals responsive thereto.

66. The computer system of claim 62 wherein each of the isolation circuits is coupled between the second input terminal of a respective input receiver and the reference voltage source.

67. The computer system of claim 62 wherein each of the isolation circuits is coupled between a respective one of the data terminals and the first input terminal of a respective input receiver.

68. The computer system of claim 62 wherein each of the input receivers comprises a pair of differential transistors coupled to each other through a common node, and wherein each of the isolation circuits comprises a respective bias circuit operable responsive to a respective one of the activate signals to bias the differential transistors to a non-linear operating range.

69. The computer system of claim 68 wherein each of the bias circuits is coupled to the common node of the respective input receiver.

* * * * *